United States Patent
Winter et al.

(10) Patent No.: US 6,703,969 B2
(45) Date of Patent: *Mar. 9, 2004

(54) METHOD FOR DETECTING AND CORRECTING NON-LINEARITIES IN A MICROWAVE RADAR SYSTEM

(75) Inventors: Klaus Winter, Schwieberdingen (DE); Hermann Winner, Karlsruhe (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

This patent is subject to a terminal disclaimer.

(21) Appl. No.: 10/018,150

(22) PCT Filed: Mar. 31, 2001

(86) PCT No.: PCT/DE01/01278

§ 371 (c)(1),
(2), (4) Date: Apr. 8, 2002

(87) PCT Pub. No.: WO01/79880

PCT Pub. Date: Oct. 25, 2001

(65) Prior Publication Data

US 2002/0158697 A1 Oct. 31, 2002

(30) Foreign Application Priority Data

Apr. 14, 2000 (DE) .......................... 100 18 552

(51) Int. Cl.[7] ................................. G01S 7/40
(52) U.S. Cl. ....................... 342/174; 342/165
(58) Field of Search ................ 342/165, 166, 342/167, 168, 169, 170, 171, 172, 173, 174

(56) References Cited

U.S. PATENT DOCUMENTS

| | | | | | |
|---|---|---|---|---|---|
| 3,735,402 | A | * | 5/1973 | Mosher | 342/109 |
| 4,123,719 | A | * | 10/1978 | Hopwood et al. | 327/5 |
| 4,190,362 | A | * | 2/1980 | Dubrunfaut | 356/5.07 |
| 4,328,552 | A | * | 5/1982 | Stovall | 702/111 |
| 5,313,214 | A | * | 5/1994 | Graziano et al. | 342/200 |
| 5,387,918 | A | * | 2/1995 | Wiesbeck et al. | 342/128 |
| 5,477,226 | A | * | 12/1995 | Hager et al. | 342/120 |
| 5,694,132 | A | * | 12/1997 | Johnson | 342/200 |
| 5,719,580 | A | * | 2/1998 | Core | 342/100 |
| 6,072,426 | A | | 6/2000 | Roos | |
| 6,133,795 | A | * | 10/2000 | Williams | 331/9 |
| 6,420,998 | B2 | * | 7/2002 | Winter et al. | 342/174 |
| 6,445,335 | B1 | * | 9/2002 | Tamatsu | 342/70 |

FOREIGN PATENT DOCUMENTS

| | | |
|---|---|---|
| DE | 38 30 992 | 3/1990 |
| DE | 195 31 540 | 2/1997 |
| DE | 197 13 967 | 10/1998 |
| WO | 92 18876 | 10/1992 |

OTHER PUBLICATIONS

Li Yang et al; Novel FM nonlinear correction method based on periodic monitoring and adaptive adjustment of FMCW source; Sep. 2000.

* cited by examiner

*Primary Examiner*—Thomas H. Tarcza
*Assistant Examiner*—Isam Alsomiri
(74) *Attorney, Agent, or Firm*—Kenyon & Kenyon

(57) ABSTRACT

A method for detecting and compensating for nonlinearities in a microwave radar system, in which a transmitted signal frequency-modulated according to a defined function is generated with a transmitting oscillator, and from the mixing of the transmitted signal with a received signal reflected from an object, a distance of the microwave radar system from the object is ascertained. In defined time windows, instead of a trigger voltage effecting frequency modulation, a defined constant test trigger voltage is switched to the transmitting oscillator; a reference signal ascertained in the context of the respective constant test trigger voltage, which signal corresponds to a frequency value of the transmitting oscillator, is employed to correct the characteristic for the frequency modulation and thus to compensate for nonlinearities.

2 Claims, 2 Drawing Sheets

METHOD FOR DETECTING AND CORRECTING NON-LINEARITIES IN A MICROWAVE RADAR SYSTEM

BACKGROUND INFORMATION

It is known, for example from German Patent No. 197 13 967, that in a system for distance measurement in the vicinity of motor vehicles, a so-called frequency-modulated continuous wave (FMCW) microwave radar sensor is present. This radar sensor includes as essential elements a transmitting oscillator, a mixer, and an antenna system for radiating and receiving the radar beams reflected from an object. The transmitted signal is, for example, frequency-modulated with a defined ramp function, so that on the basis of the transit time of the received reflected signals, a frequency of the transmitted signal modified in the interim by the modulation ramp is present; and that frequency difference is a direct indication of the distance measurement.

The linearity of the aforementioned ramp function and of the emitted frequency ramp is critically important in terms of the measurement accuracy, selectivity, and sensitivity of the FMCW microwave radar. In order to ensure generation of the linear frequency ramps for the modulation operation, there is also present in the known arrangement a reference oscillator whose output signal is mixed with the transmitted signal, directly in the radar sensor, in parallel with the actual distance measurement. From the demodulation of this signal it is possible to generate a reference variable that contains any nonlinearity in the transmission branch of the radar sensor and that therefore can be appropriately taken into account upon analysis.

In conventional microwave radar systems, a frequency control system (FLL or PLL control loop), which is implemented with corresponding additional (usually complex) circuit features, may possibly also be used to achieve sufficiently good linearity of the frequency ramp. These frequency control systems and the circuit components belonging thereto must be continuously monitored as to functionality during operation, since any faulty behavior within the frequency control circuit results in modulation with insufficiently linear frequency ramps.

With the known arrangements, therefore, although it is possible to carry out so-called real-time frequency control to the desired modulation frequency with a correction of the nonlinearities, a relatively high level of circuit complexity is necessary for the purpose.

SUMMARY OF THE INVENTION

The present invention provides a method for detecting and correcting nonlinearities in a microwave radar system, in which a transmitted signal frequency-modulated according to a defined function is generated with a transmitting oscillator, and from the mixing of the transmitted signal with a received signal reflected from an object, a distance of the microwave radar system from the object is ascertained. Advantageously, according to the present invention it is provided that in defined time windows, instead of a trigger voltage effecting frequency modulation provided for in normal measurement cycles, a defined constant test trigger voltage, or a successive series of such voltages, is switched to the transmitting oscillator.

It is now possible, in simple fashion, to employ the reference signal ascertained in the context of the respective constant test trigger voltage, which signal is intended to correspond to a frequency value of a transmitting oscillator, to correct the characteristic for the frequency modulation and thus to compensate for nonlinearities. The principle of the invention is thus that the voltage/frequency characteristic of the transmitting oscillator operating in the millimeter wave region is measured by a test function.

The test triggering of the oscillator is accomplished by way of the constant trigger voltage, which is applied, for the defined time window, to the transmitting oscillator (VCO). The test voltage is converted at the transmitting oscillator into a transmission frequency, and the latter is mixed with the frequency of a reference oscillator (DRO), e.g. with its sixth harmonic. The mixed frequency is then proportional to the emitted oscillator frequency; the frequency of the reference oscillator can be selected in such a way that the mixed frequency lies in a region<1 GHz.

For the usual instance of a ramp as modulation function for the transmitting oscillator, there is then generated from the measurement result a ramp function, suitably pre-distorted in the voltage region, that takes into account and compensates for the nonlinearity of the voltage/frequency characteristic of the transmitting oscillator. These nonlinearities can also be caused, for example, by a nonlinear frequency ramp in normal operation due to a fault in the ramp generator or in a control loop (PLL or FLL), and by a malfunction of a reference oscillator (DRO) or a defective U/f conversion by the transmitting oscillator (Gunn oscillator).

According to a preferred embodiment, the method according to the present invention is carried out with a step-shaped test ramp whose individual steps form the time window $\Delta t$ with test trigger voltages each of a different magnitude, and whose steps each exhibit a defined and possibly also constant excursion. At each step, the actual frequency value of the transmitting oscillator is then ascertained.

This linearity test takes place cyclically, for example once per second, during operation of the microwave radar system. Advantageously, after a defined number rho of measurement cycles, preferably at every tenth measurement cycle, and once upon initialization of the microwave radar, the step-shaped test ramp is switched to the transmitting oscillator and the test ramp is then analyzed in such a way that from the measured frequency values, the difference between the excursions of the frequency values and the excursions of the test ramp is ascertained. The magnitudes of the excursion differences of adjacent steps are added, and the sum is compared to an error threshold.

In order to minimize the memory outlay necessary for the aforementioned calculation, a linearity indicator $\delta$ is formed that is ascertained by successive calculation of sums of the excursion differences. For that purpose the transmitting oscillator is run up from the lowest possible frequency over the entire triggering range in constant step widths, thereby ideally yielding for the intermediate frequency a step curve with a constant excursion in each case. In the next step, the magnitude of the excursion difference $|\Delta exc|$ from step n to step n−1 is calculated for a total number of k steps, and is then summed over all excursion differences. The result is the following equation for the linearity indicator $\delta$:

$$\delta = \sum_{n=1}^{k-1} |\Delta exc_{n+1} - \Delta exc_n| \qquad (1)$$

where $$\text{excursion}_n = f_{step(n)} - f_{step(n-1)} \qquad (2).$$

The frequency of the reference signal resulting from the mixing can, according to an advantageous embodiment, be divided down with a frequency divider until it can be measured with sufficient accuracy during the defined time window. This therefore yields a direct association between the applied test voltage value and the oscillator frequency.

The invention furthermore makes it possible, in advantageous fashion, for the voltage/frequency characteristic of the module for generating the function for frequency modulation to be updated, in consideration of the reference signal, during the aforementioned time window; and for the updated voltage/frequency characteristic to be employed during operation of the microwave radar system, outside the time window, for frequency modulation of the transmitting oscillator. By varying the test trigger voltage in successive time windows it is thus possible, in simple fashion, to ascertain and update the entire voltage/frequency characteristic if it has changed, for example, as a result of temperature influences. The characteristic thus determined can then be taken into account in generating a modulation ramp for the trigger voltage profile in normal operation, the result being that a linear frequency ramp is emitted by the microwave radar.

The method according to the present invention as a whole permits an economical configuration of a microwave radar system having the necessary frequency control components, since the updating and correction of the voltage/frequency characteristic can, without major additional circuit complexity, be integrated as control instructions into a software program for generating a frequency modulation ramp. The proposed method is moreover robust in terms of fluctuations in component values in the control electronics, and furthermore easily adaptable to new operating conditions.

Detailed Description

Figure 1:
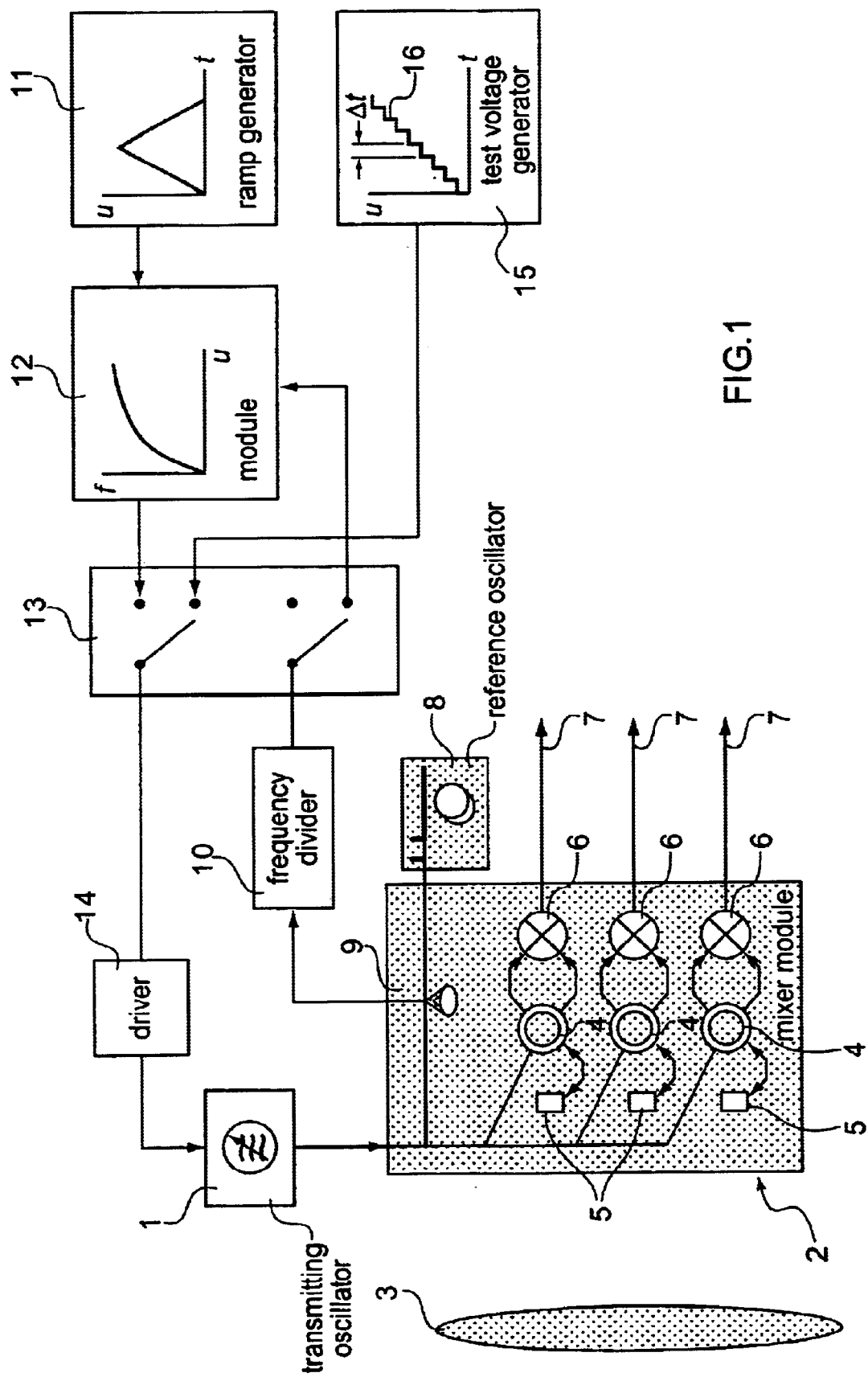
FIG. 1 shows a block diagram of circuitry and functional components of a microwave radar system with a test ramp for a linearity test.

FIG. 1 depicts a block diagram with the elements of an FMCW microwave radar system that are important for the present invention. A voltage-controlled transmitting oscillator (Gunn VCO), for example in the 76.5-GHz frequency range, is present; its output signal is sent to a transmit/receive module 2. This transmit/receive module 2, with a lens 3 placed in front of it, can be, for example, a constituent of a radar sensor on a motor vehicle, with which the distance to an object, for example a preceding vehicle, is to be ascertained.

In transmit/receive module 2, the transmitted signal is sent via coupling modules 4 to (in this case) three antennas 5 for lateral detection of an object, and the received signal reflected from the object is mixed in respective mixers 6 with the transmitted signal $F_{GUNN}$; the mixed signal at outputs 7 is employed, in the manner already mentioned above, for distance measurement. Also present is a reference oscillator (DRO) 8 whose output signal is combined with the transmitted signal $f_{GUNN}$ in order to generate an intermediate frequency signal $f_{ZF}$. Additionally present is a mixer module 9 whose output signal is sent through a frequency divider 10 in order to generate the reference signal (explained below) in a test cycle. The combinations of the signals in module 2 are accomplished in a coupling procedure typical in microwave technology.

In the normal operating state, a ramp generator 11 is used to generate a linear ramp signal u(t) from which, in a module 12, a characteristic voltage/frequency characteristic f(u) can in turn be derived. By way of a switcher 13 indicated symbolically here, which as a rule is implemented in software with program control instructions, in the dashed-line switch position the voltage-controlled transmitting oscillator 1 is modulated as to its frequency, in accordance with the characteristic of module 12, by way of a driver 14.

A test voltage generator 15 generates, in defined time windows Δt, a defined constant test trigger voltage (here a test ramp 16) which in these time windows Δt is switched via switch 13, instead of the trigger voltage of module 12 effecting the frequency modulation, to transmitting oscillator 1.

The test signal delivered by frequency divider 10 in these time windows Δt, which signal corresponds to a specific frequency value of transmitting oscillator 1, is now employed for correction of the voltage/frequency characteristic in module 12, again switched via switch 13. A voltage ramp suitably pre-distorted in the voltage range, that takes into account the nonlinearity within the microwave radar system, is thus generated from the test signals for the modulation function of transmitting oscillator 1.

Figure 2:
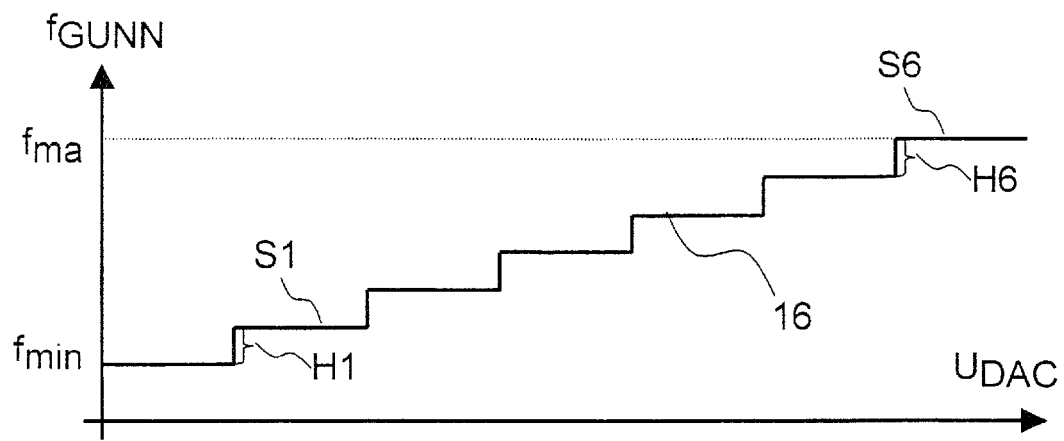
FIG. 2 shows a step curve of the test ramp for triggering a transmitting oscillator in the microwave radar system according to FIG. 1.

In FIG. 2, on the basis of test ramp 16 of test generator 15, the ideal frequency $F_{GUNN}$ of transmitting oscillator 1 resulting therefrom is plotted, from $f_{min}$ to $f_{max}$, against a trigger voltage $U_{DAC}$ having steps S1 through S6 that differ from one another by excursions H1 through H6 respectively. The sum of all excursion differences, generated from the calculation according to equation (1), $$\delta = \sum_{n=1}^{k-1} |\Delta exc_{n+1} - \Delta exc_n|$$

where $$\text{excursions}_n = f_{step(n)} - f_{step(n-1)}$$

following from the formula for a linearity indicator δ, is then compared to the defined maximum value $f_{max}$. If it exceeds the maximum value $f_{max}$, this is evaluated as a positive error detection, and a correction of the characteristic is performed as described with reference to FIG. 1. Since frequency excursions H1 through H6 might not be ascertained exactly in a time window Δt, it is important to define a minimum number of required differential counter states per step frequency in order to obtain a corresponding minimum accuracy for the excursion calculation and thus also for the calculation of all excursion differences.

Figure 3:
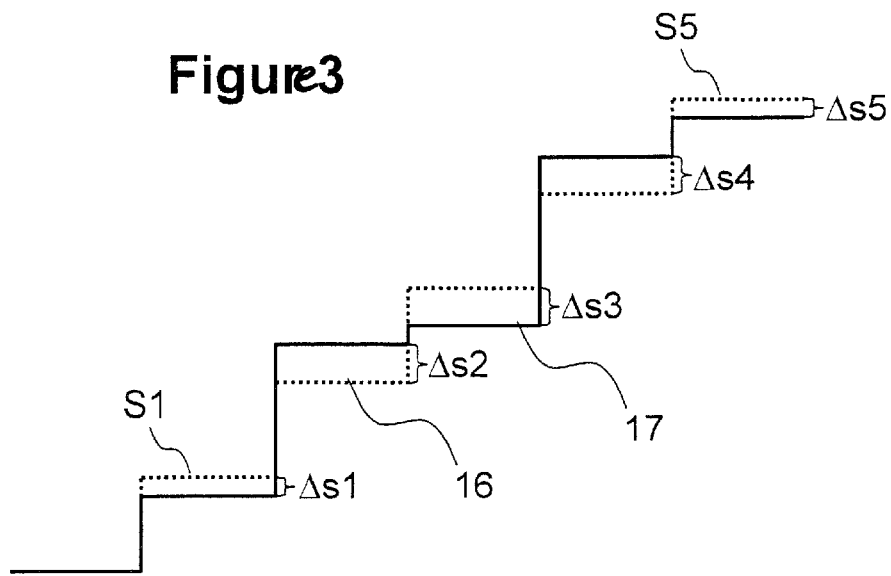
FIG. 3 shows the measured step curve for the linearity test, compared to the exact step curve.

In FIG. 3, the dotted line shows the exact step curve 16 with steps S1 through S5, and the solid line shows the measured step curve 17. The positive and negative deviations Δs1 through Δs5 are also drawn in here, accompanying each excursion between steps S1 and S5. For the linearity monitoring function using the sum of the excursion differences, the systematic error is maximal when the calculated excursions alternately exhibit a maximum positive and maximum negative error. This occurs when the error in the step frequency calculation is alternatingly maximally positive and maximally negative, as is evident from FIG. 3. In the worst case, the following is thus obtained for linearity indicator 6 as the systematic error:

$$\delta = (=s1 + 2*\Delta s2 + \Delta s3) + (\Delta s2 + 2*\Delta s3 + \Delta s4) + (\Delta s3 + 2*\Delta s4 + \Delta s5) + \ldots \quad (3)$$

or $$\delta = \sum_{n=2}^{k-1} (\Delta s_{n-1} + 2*\Delta s_n + \Delta s_{n+1}) \quad (4)$$

$$\delta = \Delta s_1 + 3*\Delta s_2 + 4*\sum_{n=3}^{k-2}\Delta s_n + 3*\Delta s_{k-1} + \Delta s_k \qquad (5)$$

Incorporating the frequency values for the step deviations $\Delta s1$ through $\Delta s5$, it is now possible, by simply transposing this equation, to ascertain for any maximal systematic error the number n of steps necessary therefor. For example, for a lower ramp frequency of approx. 400 MHz and a total excursion of approx. 200 MHz and a total of 10 steps with a maximum systematic error of 1 MHz, the minimum required number n that is obtained is 36.

What is claimed is:

1. A method for detecting and correcting nonlinearities in a microwave radar system, comprising:

generating, by a transmitting oscillator, a transmitted signal frequency-modulated according to a defined function;

ascertaining, from a mixing of the transmitted signal with a received signal reflected from an object, a distance of the microwave radar system from the object;

investigating linearity properties of the microwave radar system by a reference signal;

switching, in defined time windows, instead of a trigger voltage effecting frequency modulation, respective defined constant test trigger voltages to the transmitting oscillator;

employing a reference signal, which is ascertained based on the respective constant test trigger voltages, to correct a characteristic for the frequency modulation and thus to compensate for nonlinearities, the ascertained reference signal corresponding to frequency values of the transmitting oscillator, the ascertained reference signal forming a step-shaped test ramp whose individual steps form a respective one of the time windows with test voltages each of a different magnitude and whose steps each exhibit a defined excursion;

ascertaining a test signal, at each step, with generation of a corresponding frequency value of the transmitting oscillator;

switching, after a defined number of measurement cycles of the microwave radar system, the step-shaped test ramp to the transmitting oscillator;

analyzing the test ramp in such a way that from measured frequency values a difference between excursions of the frequency values and excursions of the test ramp is ascertained;

adding magnitudes of excursion differences of adjacent steps to form a sum; and comparing the sum to an error threshold.

2. The method according to claim 1, further comprising:

ascertaining a linearity indicator by successive calculation of sums of the excursion differences.

* * * * *

UNITED STATES PATENT AND TRADEMARK OFFICE
CERTIFICATE OF CORRECTION

PATENT NO. : 6,703,969 B2
DATED : March 9, 2004
INVENTOR(S) : Klaus Winter et al.

It is certified that error appears in the above-identified patent and that said Letters Patent is hereby corrected as shown below:

Title page, Item [54] and Column 1, line 2,
Title, change "NON-LINEARITIES" to -- NONLINEARITIES --;

Column 2,
Line 33, delete "rho";

Column 3,
Line 38, change "Detailed Description" to -- DETAILED DESCRIPTION --;

Column 4,
Line 58, change "6" to -- $\delta$ --; and
Line 60, change "(=s1" to -- ($\Delta$s1 --.

Signed and Sealed this

Eleventh Day of January, 2005

JON W. DUDAS
*Director of the United States Patent and Trademark Office*